(12) United States Patent
Hu et al.

(10) Patent No.: US 11,710,646 B2
(45) Date of Patent: Jul. 25, 2023

(54) FAN-OUT PACKAGING METHOD AND FAN-OUT PACKAGING PLATE

(71) Applicant: SHENZHEN XIUYI INVESTMENT DEVELOPMENT PARTNERSHIP (LIMITED PARTNERSHIP), Shenzhen (CN)

(72) Inventors: Chuan Hu, Shenzhen (CN); Yingqiang Yan, Shenzhen (CN); Yuejin Guo, Shenzhen (CN); Yingjun Pi, Shenzhen (CN); Junjun Liu, Shenzhen (CN); Edward Prack, Shenzhen (CN)

(73) Assignee: SHENZHEN XIUYI INVESTMENT DEVELOPMENT PARTNERSHIP (LIMITED PARTNERSHIP), Guangdong (CN)

( * ) Notice: Subject to any disclaimer, the term of this patent is extended or adjusted under 35 U.S.C. 154(b) by 105 days.

(21) Appl. No.: 17/274,720

(22) PCT Filed: Oct. 11, 2018

(86) PCT No.: PCT/CN2018/109773
§ 371 (c)(1),
(2) Date: Mar. 9, 2021

(87) PCT Pub. No.: WO2020/073265
PCT Pub. Date: Apr. 16, 2020

(65) Prior Publication Data
US 2022/0051908 A1 Feb. 17, 2022

(51) Int. Cl.
*H01L 23/00* (2006.01)
*H01L 21/56* (2006.01)
(Continued)

(52) U.S. Cl.
CPC .............. *H01L 21/56* (2013.01); *H01L 23/29* (2013.01); *H01L 23/3107* (2013.01); *H01L 24/92* (2013.01); *H01L 2224/92144* (2013.01)

(58) Field of Classification Search
None
See application file for complete search history.

(56) References Cited

U.S. PATENT DOCUMENTS 8,350,381 B2 * 1/2013 Theuss .................... H01L 24/97
257/723
9,331,030 B1 * 5/2016 Tsai ......................... H01L 24/20
(Continued)

FOREIGN PATENT DOCUMENTS

CN 1820360 8/2006
CN 1820360 A * 8/2006 ........... H01L 21/565
(Continued)

OTHER PUBLICATIONS

International Search Report and Written Opinion from Chinese Application No. PCT/CN2018/109773 dated Jul. 10, 2019 (English) (Year: 2019).*
(Continued)

*Primary Examiner* — Telly D Green
(74) *Attorney, Agent, or Firm* — Hogan Lovells US LLP

(57) ABSTRACT

A fan-out packaging method includes: prepare circuit patterns on one side or both sides of a substrate; install electronic parts on one side or both sides of the substrate; prepare packaging layers on both sides of the substrate; the packaging layers on both sides of the substrate package the substrate, the circuit patterns, and the electronic parts, the packaging layers being made of a thermal-plastic material; wherein the substrate is provided with a via hole; both sides of the substrate are communicated by means of the via hole; a part of the packaging layers penetrate through the via hole when the packaging layers are prepared on both sides of the (Continued)

substrate; and the packaging layers on both sides of the substrate are connected by means of the via hole.

15 Claims, 7 Drawing Sheets

(51) Int. Cl.
*H01L 23/29* (2006.01)
*H01L 23/31* (2006.01)

(56) References Cited

U.S. PATENT DOCUMENTS

| | | | |
|---|---|---|---|
| 10,121,722 B1 * | 11/2018 | Jha | ............ H01L 24/32 |
| 2002/0140108 A1 | 10/2002 | Johnson | |
| 2002/0180024 A1 | 12/2002 | Huang et al. | |
| 2006/0118941 A1 | 6/2006 | Lai et al. | |
| 2011/0241197 A1 * | 10/2011 | Theuss | ............ H01L 24/97 |
| | | | 257/E23.116 |
| 2012/0187582 A1 | 7/2012 | Chen | |
| 2014/0268619 A1 | 9/2014 | Kang et al. | |
| 2016/0035678 A1 | 2/2016 | Yoo et al. | |
| 2019/0326257 A1 * | 10/2019 | Agarwal | ............ H01L 23/3128 |

FOREIGN PATENT DOCUMENTS

| | | |
|---|---|---|
| CN | 101030570 | 9/2007 |
| CN | 101630707 | 1/2010 |
| CN | 102610533 | 7/2012 |
| CN | 102768962 | 11/2012 |
| CN | 107527884 | 12/2017 |
| WO | WO-2014010106 A1 * | 1/2014 ........... B29C 70/026 |

OTHER PUBLICATIONS

International Search Report and Written Opinion dated from Chinese Application No. PCT/CN2018/109773 dated Jul. 10, 2019.
The First Office Action issued in CN Application No. 201880095500.4, dated Jun. 2, 2022.
Office Action issued in CN Application No. 201880095500.4, dated Mar. 1, 2023.

* cited by examiner

FAN-OUT PACKAGING METHOD AND FAN-OUT PACKAGING PLATE

TECHNICAL FIELD

The present disclosure belongs to the electronic field, and in particular relates to a fan-out packaging method and a fan-out packaging plate.

BACKGROUND ART

Conventional fan-out packaging typically adopts a compression molding or transfer molding method in the outer package injection molding process, in which a thermosetting packaging material, such as epoxy, is injected into a mold and then heated to cure. Such type of thermosetting material has relatively poor high-frequency electrical performance and a large dissipation factor (or loss tangent), and then will cause large signal loss in a high-frequency section, thereby affecting receipt and transmission of high-frequency signals in a packaged device.

SUMMARY

In view of this, the present disclosure aims at providing a fan-out packaging method and a fan-out packaging plate to overcome the defects in the prior art, which reduces the dissipation factor of the packaging material, has small signal loss, and can be well applied to the packaging of high-frequency radio-frequency devices.

Technical solutions thereof are as follows:

a fan-out packaging method, including: fabricating a circuit pattern on one side or two sides of a substrate, mounting an electronic part on the one side or two sides of the substrate, and fabricating packaging layers on the two sides of the substrate, wherein the packaging layers on the two sides of the substrate encapsulate the substrate, the circuit pattern, and the electronic part therein, and the packaging layers are made of a thermoplastic material, and wherein the substrate is provided with a via hole, which makes the two sides of the substrate in communication with each other, when the packaging layers are fabricated on the two sides of the substrate, a part of the packaging layers passes through the via hole, and the packaging layers on the two sides of the substrate are connected with each other through the via hole.

In one embodiment therein, after the electronic part is mounted on the substrate, thickness of the electronic part is reduced, and then the packaging layers are fabricated.

In one embodiment therein, an external connection hole is formed in the packaging layers, the external connection hole is butted to the circuit pattern, or the external connection hole is butted to the electronic part, and the external connection hole is provided with an opening on a surface of the packaging layers.

In one embodiment therein, an outer pin is fabricated in the external connection hole through the opening of the external connection hole, and the outer pin is electrically connected to the circuit pattern, or the outer pin is electrically connected to the electronic part, wherein the outer pin is BGA or LGA.

In one embodiment therein, an interconnection hole is formed in the substrate and the packaging layers, the interconnection hole is provided with an opening on a surface of the packaging layers, the interconnection hole enables the chip to be butted to the circuit pattern, an interconnection layer is fabricated in the interconnection hole through the opening of the interconnection hole, and the chip is electrically connected to the circuit pattern through the interconnection layer.

In one embodiment therein, the substrate having the circuit pattern and the electronic part is placed in the mold, the thermoplastic material is injected into the mold, the thermoplastic material wraps the two sides of the substrate, and the thermoplastic material is molded into the packaging layers on the two sides of the substrate in the mold.

In one embodiment therein, the mold is provided therein with a support column, the support column abuts against and supports the substrate, and gaps between the two sides of the substrate and the mold are injected with the thermoplastic material.

In one embodiment therein, the substrate is provided with a via hole or a via hole is fabricated in the substrate, the via hole communicates the two sides of the substrate, the packaging layers are fabricated on the two sides of the substrate, a part of the packaging layers passes through the via hole, and the packaging layers on the two sides of the substrate are connected to each other through the via hole.

In one embodiment therein, an entirety constituted by the substrate, the circuit pattern, the electronic part, and the packaging layers is flexible and bendable.

In one embodiment therein, the thermoplastic material is LCP.

A fan-out packaging plate, including a substrate, and a packaging layer made of a thermoplastic material, wherein one side of the substrate is provided with a circuit pattern or an electronic part, the substrate and the packaging layer encapsulate the circuit pattern or the electronic part; alternatively, the substrate is provided with a circuit pattern or an electronic part, two sides of the substrate are each provided with the packaging layer, the packaging layers on the two sides of the substrate encapsulate the substrate, the circuit pattern, and the electronic part, wherein the substrate is provided with a via hole, a part of the packaging layers on the two sides of the substrate passes through the via hole, and the packaging layers on the two sides of the substrate are connected with each other through the via hole.

In one embodiment therein, the packaging layer is provided with an external connection hole, the external connection hole is butted to the circuit pattern or the electronic part, and the external connection hole is provided with an opening in a surface of the packaging layer.

In one embodiment therein, the external connection hole is provided therein with an outer pin, the outer pin is electrically connected to the circuit pattern, or the outer pin is electrically connected to the electronic part, wherein the outer pin is BGA or LGA.

In one embodiment therein, an interconnection hole is provided in the substrate and the packaging layer, the interconnection hole is provided with an opening on a surface of the packaging layer, the interconnection hole is butted to the chip and the circuit pattern, the interconnection hole is provided therein with an interconnection layer, and the chip is electrically connected to the circuit pattern through the interconnection layer.

In one embodiment therein, an entirety constituted by the substrate, the circuit pattern, the electronic part, and the packaging layer is flexible and bendable.

Beneficial effects of the present disclosure lie in:

1. the fan-out packaging method includes packaging on one side of the substrate or packaging on two sides of the substrate;

packaging on one side of the substrate:

fabricating the circuit pattern on one side of the substrate, mounting the electronic part (wherein the electronic part includes, but is not limited to, chip, bare die, electronic element, electronic device, and also may be any part needed on a circuit) on the substrate, wherein in this step, the electronic part may be fixed on the substrate, or not, fabricating the packaging layer on one side of the substrate, wherein the packaging layer and the substrate encapsulate the circuit pattern or the electronic part therein, and the packaging layer is made of a thermoplastic material; the packaging layer may be directly attached to the surface of the substrate, and the packaging layer also may wrap a part of the substrate, so that the packaging layer may be fixed on the substrate, or other structures buckled with each other are provided on the substrate or the packaging layer, so that the packaging layer is fixed on the substrate;

packaging on the two sides of the substrate:

fabricating the circuit patterns on the two sides of the substrate, mounting the electronic parts on the substrate, wherein the electronic parts are merely provided on one side of the substrate, or the two sides of the substrate are both provided with the electronic parts, fabricating the packaging layers on the two sides of the substrate, wherein the packaging layers on the two sides of the substrate encapsulate the substrate, the circuit patterns and the electronic parts therein, and the packaging layers are made of a thermoplastic material. The packaging layers are directly attached to the substrate, or the packaging layers on the two sides of the substrate are connected across edges of the substrate, or other structures buckled with each other are provided on the substrate or the packaging layers, so that the packaging layers are fixed on the substrate.

Using the thermoplastic material to replace the conventional thermosetting material for fan-out and packaging has low loss of electronic performance, and a higher speed, especially high-frequency devices have low loss, for example, the thermoplastic material is applied to an environment such as 5G, 24 GHz and 77 GHz sensors for vehicle-mounted safety, and 60 GHz high-frequency wireless HDMI.

In the above, the substrate is provided with the via hole or the via hole is fabricated on the substrate, the via hole communicates the two sides of the substrate, the packaging layers are fabricated on the two sides of the substrate, a part of the packaging layers passes through the via hole, and the packaging layers on the two sides of the substrate are connected through the via hole, so that the packaging layers on the two sides of the substrate are connected into one piece, and the packaging layers on the two sides of the substrate are pulled by that part of packaging layers passing through the via hole so as to sandwich the substrate, thus the packaging layers on the two sides are fixed on the substrate.

Preferably, the thermoplastic material is LCP.

2. After the electronic part is mounted on the substrate, at this time, position of the electronic part relative to the substrate is fixed, and the thickness (the thickness refers to height of the electronic part protruding relative to the substrate) of the electronic part is reduced by grinding, cutting or other methods, and then the packaging layers are fabricated. After the thickness of the electronic part is reduced, the thickness of the packaging layers may be reduced, and the thickness of the packaged entirety constituted by the substrate, circuit pattern, electronic part, and packaging layers may be greatly reduced. After the electronic part is mounted on the substrate, the electronic part is thinned, and only that required part of the electronic part may be retained, and an excessive part is cut away. The thickness of the electronic part may be reduced to a minimum degree without considering the mechanical strength required when transferring the electronic part.

3. After the packaging layers are fabricated, the circuit pattern and the electronic part are blocked by the packaging layers, the external connection hole is formed in the packaging layers, the external connection hole is butted to the circuit pattern, or the external connection hole is butted to the electronic part, the external connection hole is provided with an opening in the surface of the packaging layers, and a part of the circuit pattern or a part of the electronic part is exposed through the external connection hole, for example, to expose the circuit pin of the circuit pattern for external connection, and the part pin of the electronic part for external connection from the packaging layers and the substrate, so that the circuit pattern and the electronic part may be electrically connected to other devices through the external connection hole.

Alternatively, the two sides of the substrate are defined as "first side" and "second side", respectively, when the electronic part or the circuit pattern is located on the first side of the substrate, but the electronic part or the circuit pattern needs to be externally connected from the second side of the substrate, the circuit pattern or the electronic part is blocked by the substrate and the packaging layer, in this case, the external connection hole is formed in the packaging layers and the substrate, and the external connection hole is provided with an opening in the packaging layer on the second side, thus, a part of the circuit pattern or a part of the electronic part is exposed for external connection.

4. The external connection hole per se and the opening of the external connection hole provide an operation space for external connection, the outer pin is fabricated in the external connection hole through the opening of the external connection hole, and the outer pin is electrically connected to the circuit pattern, or the outer pin is electrically connected to the electronic part. The outer pin may be accommodated in a space of the external connection hole, or the outer pin extends out from the external connection hole, and the outer pin is provided on an outer surface of the packaging layer. The outer pin is BGA (Ball Grid Array) or LGA (Land Grid Array).

5. The electronic part is provided with the part pin for wiring, the electronic part is provided on the first side of the substrate, the part pin faces the substrate, the interconnection hole is formed in the substrate and the packaging layer, the interconnection hole is provided with an opening on the surface of the packaging layer, the interconnection hole passes through the packaging layer and the substrate to expose the part pin, and the interconnection hole enables the chip to be butted to the circuit pattern, and the interconnection layer is fabricated in the interconnection hole through the opening of the interconnection hole, so that the electronic part is electrically connected to the circuit pattern through the interconnection layer, thus realizing the electrical connection between the electronic part and the circuit pattern.

The conventional thermoplastic material packaging process is used in cooperation with the conventional flip-chip fan-out process, and if it is replaced with the packaging method of the present disclosure, it is quite easy to cause incompatibility of the two processes, and the fan-out and packaging cannot be completed. Therefore, preferably, the interconnection between the electronic part and the circuit pattern is realized by adopting the manner of providing the interconnection hole in the present disclosure, then the packaging process using the thermoplastic material in the present disclosure may be well compatible.

6. The substrate having the circuit pattern and the electronic part is placed in the mold, and the thermoplastic material is injected into the mold, the thermoplastic material wraps the two sides of the substrate, and the thermoplastic material is molded into the packaging layers on the two sides of the substrate in the mold, the packaging layers are molded simultaneously on the two sides of the substrate, with simple process, and high manufacturing efficiency.

Preferably, the unmolded thermoplastic material in the mold is pressurized. As the unmolded thermoplastic material has fluidity, pressurization may enable the unmolded thermoplastic material to flow to cover gaps and channels on the substrate, the circuit pattern and the electronic part, thereby avoiding formation of voids during the packaging.

7. The mold is provided therein with the support column, the support column abuts against and supports the substrate, and gaps between the two sides of the substrate and the mold are injected with the thermoplastic material. The support column abuts against the first side or the second side of the substrate, or simultaneously abuts against the first side and the second side, to support the substrate, thus avoiding displacement of the substrate during the injection molding, and improving the molding quality of the packaging layers.

8. A pressure P is applied to the unmolded thermoplastic material in the mold, wherein 1.1 atmospheres≤P≤10 atmospheres, so that the unmolded thermoplastic material flows to cover the gaps and channels on the substrate, the circuit pattern, and the electronic part, thereby avoiding formation of voids during the packaging.

9. The entirety constituted by the substrate, the circuit pattern, the electronic part, and the packaging layers is flexible and bendable. As the fan-out packaging method of the present disclosure is compatible with the substrate of FPC, the PFC substrate may be adopted, and factors such as the structure of the electronic part, and components and thickness of the packaging layers are reasonably configured, so that the packaging product (an entirety constituted by the substrate, the circuit pattern, the electronic part, and the packaging layers) obtained by the fan-out packaging method of the present disclosure is flexible and bendable as a whole.

ILLUSTRATION OF REFERENCE SIGNS

100. substrate, 101. mold, 102. support column, 103. shaping portion, 110A, 1108. circuit pattern, 120. via hole, 130A, 130B. interconnection hole, 140. external connection hole, 200A, 200B. electronic part, 210. part pin, 220. patch material, 300. packaging layer, 310. external connection hole, 400. outer pin, 410A, 410B. interconnection layer.

DETAILED DESCRIPTION OF EMBODIMENTS

The present disclosure is further described in detail below, but the embodiments of the present disclosure are not limited thereto.

Embodiment 1

As shown in FIGS. 1 to 7, in the present embodiment, packaging layers are fabricated simultaneously on two sides of a substrate for packaging, but it is not limited thereto, while a method of the present disclosure further may be used for packaging only a single side of the substrate.

Figure 1:
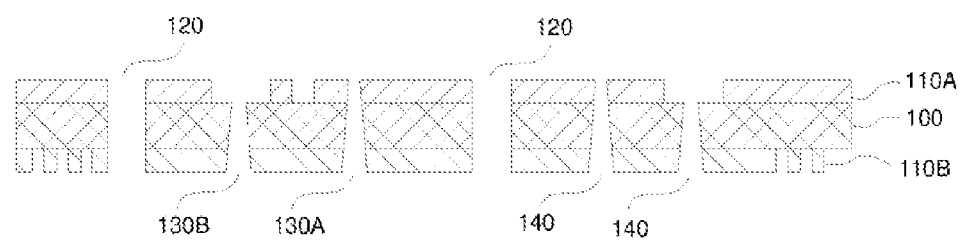
FIG. 1 is a structural view of circuit patterns, external connection holes and interconnection holes fabricated in a substrate in Embodiment 1 of the present disclosure.

As shown in FIG. 1, circuit patterns 110A and 1108 are fabricated on two sides of a substrate 100, and the circuit patterns 110A and 1108 on the two sides of the substrate 100 may be electrically connected to each other or not. The circuit patterns 110A and 1108 include, but are not limited to, wirings, interconnection lines, antennas, and pins with electronic functionality, and the materials for fabricating the circuit patterns 110A and 1108 include, but are not limited to, copper, or silver, or iron, or other conductive materials or semiconductor materials. Via holes 120, external connection holes 140 and interconnection holes 130A and 1308 are fabricated on the substrate 100.

Figure 2:
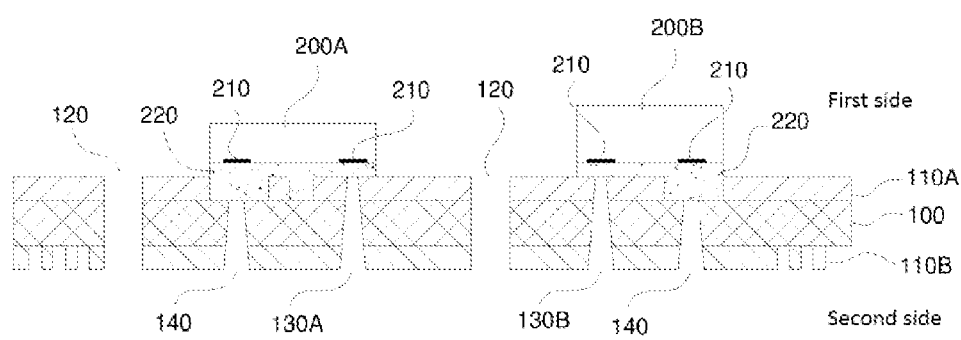
FIG. 2 is a structural view of mounting electronic parts on the substrate according to Embodiment 1 of the present disclosure.

As shown in FIG. 2, the electronic parts 200A and 200B are pasted to the substrate 100 by a patch material 220, and the electronic parts 200A and 200B in FIG. 2 are disposed only on a first side of the substrate 100, but it is not limited to the present embodiment, and the electronic parts 200A and 200B also may be disposed on both sides of the substrate 100. The electronic parts 200A and 200B each have a part pin 210, the part pins 210 on the electronic parts 200A and 200B face the substrate 100, and the electronic parts 200A and 200B may be electrically connected to the circuit pattern 110A on the first side of the substrate 100 or the circuit pattern 1108 on a second side of the substrate 100, or not connected to the circuit pattern on the first side of the substrate or the circuit pattern on a second side of the substrate. In the above, the electronic parts 200A and 200B include, but are not limited to, chips, bare dies, electronic elements, and electronic devices, and the electronic part 200A and the electronic part 200B shown in FIG. 2 have different heights.

Figure 3:
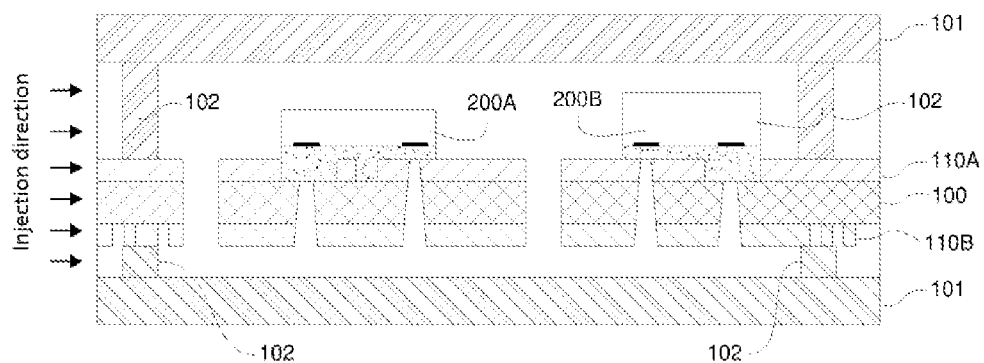
FIG. 3 is a structural view of placing the substrate in a mold according to Embodiment 1 of the present disclosure.

As shown in FIG. 3, the substrate 100 having the circuit patterns 110A and 1108 and the electronic parts 200A and 200B is placed in a mold 101, the mold 101 is provided therein with a support column 102, wherein the support column 102 abuts against and supports the substrate 100, gaps between the two sides of the substrate 100 and the mold 101 are injected with a thermoplastic material, and the support column 102 abuts against the first side and the second side of the substrate 100 to provide support for the substrate 100, thus avoiding the substrate 100 from being displaced in the injection molding, and improving the molding quality of the packaging layer 300.

Figure 4:
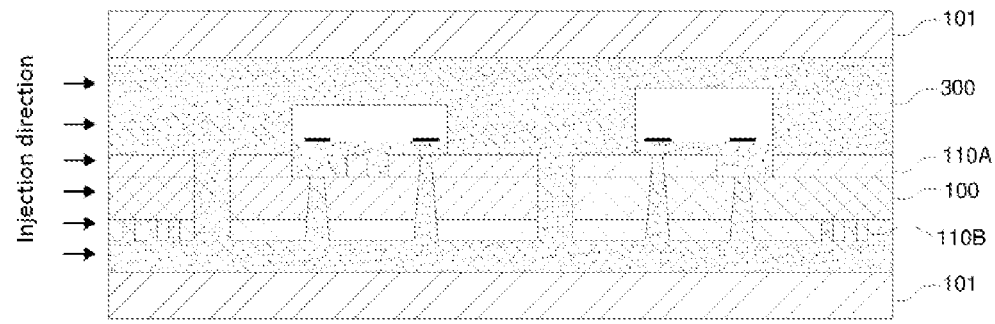
FIG. 4 is a structural view of injecting a thermoplastic material into the mold according to Embodiment 1 of the present disclosure.

As shown in FIG. 4, the thermoplastic material is injected into the mold 101, the thermoplastic material wraps the two sides of the substrate 100, and the thermoplastic material is molded into the packaging layers 300 on the two sides of the substrate 100 in the mold 101. Preferably, the unmolded thermoplastic material in the mold 101 is pressurized. As the unmolded thermoplastic material has fluidity, pressurization may enable the unmolded thermoplastic material to flow to cover gaps and channels on the substrate 100, the circuit patterns 110A and 1108 and the electronic parts 200A and 200B, thereby avoiding formation of voids during the packaging, moreover, the via hole 120 communicates the thermoplastic materials on the two sides of the substrate 100, and the via hole 120 is filled up with the thermoplastic material.

Figure 5:
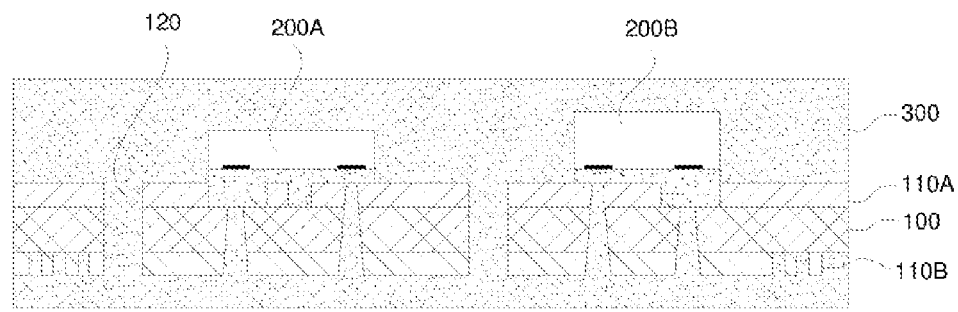
FIG. 5 is a structural view of a molded packaging layer according to Embodiment 1 of the present disclosure.

As shown in FIG. 5, the thermoplastic material is cured on the two sides of the substrate 100 and formed into the packaging layers 300, to encapsulate the substrate 100, the circuit patterns 110A and 1108 and the electronic parts 200A and 200B therein. After curing, a part of the packaging layers 300 passes through the via hole 120, and the packaging layers 300 on the two sides of the substrate 100 are connected to each other through the via hole 120, so that the packaging layers 300 on the two sides of the substrate 100 are connected into one piece, and the packaging layers 300 on the two sides of the substrate 100 are pulled by that part of the packaging layers 300 passing through the via hole 120 so as to sandwich the substrate 100, thus the packaging layers 300 on the two sides are fixed on the substrate 100.

Using the thermoplastic material to replace the conventional thermosetting material for fan-out and packaging has low loss of electronic performance, and a higher speed, especially high-frequency devices have low loss, for example, the thermoplastic material is applied to an environment such as 5G, 24 GHz and 77 GHz sensors for vehicle-mounted safety, and 60 GHz high-frequency wireless HDMI. In the present embodiment, the thermoplastic material is LCP.

After the packaging layers 300 are fabricated, the circuit patterns 110A and 1106 and the electronic parts 200A and 200B are blocked by the packaging layers 300, then the external connection hole 140 and the interconnection hole 130 need to be opened again.

Figure 6:
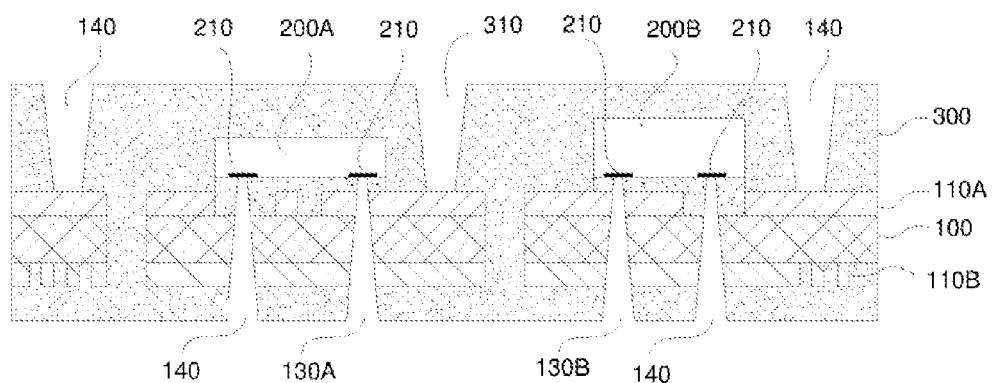
FIG. 6 is a structural view of fabricating external connection holes and interconnection holes in the packaging layer according to Embodiment 1 of the present disclosure.
Figure 7:
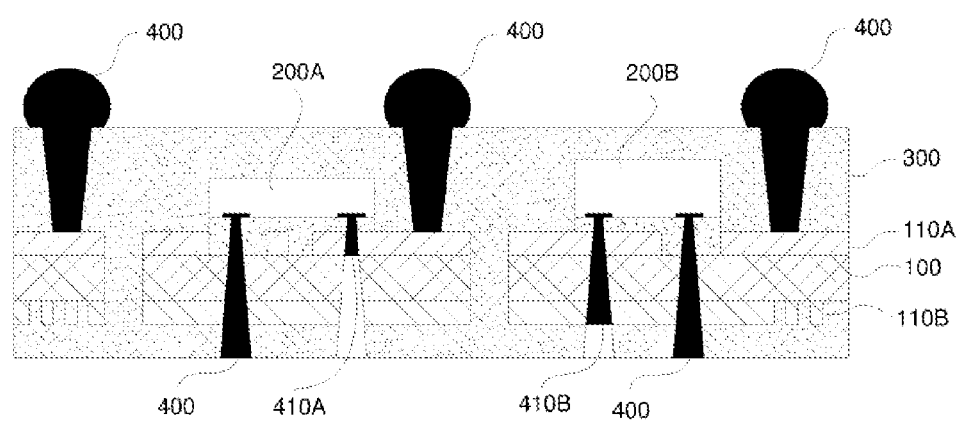
FIG. 7 is a structural view of a packaged circuit board according to Embodiment 1 of the present disclosure.

The circuit pattern 110A is blocked by the packaging layer 300 when external connection is needed, as shown in FIG. 6, the external connection hole 140 is fabricated in the packaging layer 300 on the first side of the substrate 100, the external connection hole 140 is provided with an opening in the packaging layer 300, and as shown in FIG. 7, an outer pin 400 is fabricated in the external connection hole 140 through the opening of the external connection hole 140, and the outer pin 400 is electrically connected to the circuit pattern 110A. As shown in FIG. 6, the electronic parts 200A and 200B are located on the first side of the substrate 100, but when the electronic parts 200A and 200B or the circuit pattern 110A need to be externally connected from the second side of the substrate 100, the circuit pattern 110A or the electronic parts 200A and 200B are blocked by the substrate 100 and the packaging layer 300, then, the external connection hole 140 is fabricated in the packaging layers 300 and the substrate 100, and the external connection hole 140 is provided with an opening in the packaging layer 300 on the second side, to expose part pins 210 of the electronic parts 200A and 200B for external connection. As shown in FIG. 7, the outer pin 400 are fabricated in the external connection hole 140 through the opening of the external connection hole 140, the outer pin 400 is electrically connected to the part pins 210 of the electronic parts 200A and 200B. In the above, the outer pin 400 may be accommodated in a space of the external connection hole 140, or the outer pin 400 extends out of the external connection holes 140.

On the other hand, as shown in FIGS. 6 and 7, the electronic parts 200A and 200B are provided with the part pins 210 for wiring, the electronic parts 200A and 200B are provided on the first side of the substrate 100, the part pins 210 face the substrate 100, the interconnection holes 130A and 130B are fabricated in the substrate 100 and the packaging layers 300, the interconnection holes 130A and 130B are each provided with an opening on a surface of the packaging layer 300 on the second side, the interconnection holes 130A and 130B pass through the packaging layers 300 and the substrate 100 to expose the part pins 210, and the interconnection holes 130A and 130B enable the part pins 210 of the electronic parts 200A and 200B to be butted to the circuit patterns 110A and 1106, and interconnection layers 410A and 410B are fabricated in the interconnection holes 130A and 130B through the openings of the interconnection holes 130A and 130B, so that the electronic part 200A is electrically connected to the circuit pattern 110A on the first side through the interconnection layer 410A, and the electronic part 200B is electrically connected to the circuit pattern 1108 on the second side through the interconnection layer 410B, wherein the interconnection layers 410A and 410B may be made of a conductive material or a semiconductor material through a process such as deposition growth, plating, and soldering.

The conventional thermoplastic material packaging process is used in cooperation with the conventional flip-chip fan-out process, and if it is replaced with the packaging method of the present disclosure, it is quite easy to cause incompatibility of the two processes, and the fan-out and packaging cannot be completed. Therefore, preferably, the interconnection between the electronic parts 200A and 200B and the circuit patterns 110A and 1108 is realized by adopting the manner of providing the interconnection holes 130 in the present disclosure, then the packaging process using the thermoplastic material in the present disclosure may be well compatible.

In the present embodiment, an FPC substrate 100 is adopted, and a packaging product (an entirety constituted by the substrate 100, the circuit patterns 110A and 1108, the electronic parts 200A and 200B, and the packaging layers 300) obtained is flexible and bendable as a whole.

Embodiment 2

Embodiment 2 differs from Embodiment 1 in that:
the electronic parts 200A and 200B are thinned and then packaging is carried out.

Figure 8:
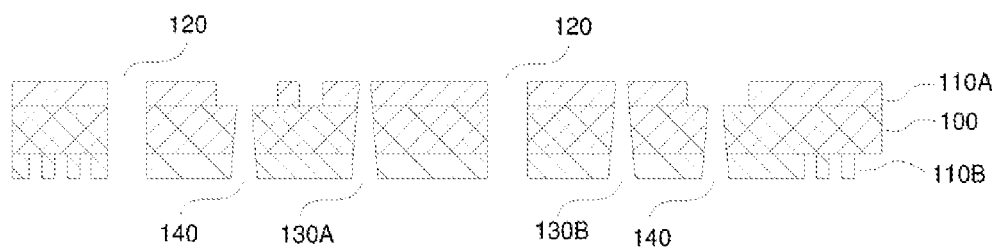
FIG. 8 is a structural view of fabricating circuit patterns, external connection holes and interconnection holes in a substrate in Embodiment 2 of the present disclosure.

As shown in FIG. 8, the circuit patterns 110A and 110B are fabricated on the two sides of the substrate 100, and the via hole 120, the external connection hole 140 and the interconnection holes 130A and 130B are fabricated in the substrate 100.

Figure 9:
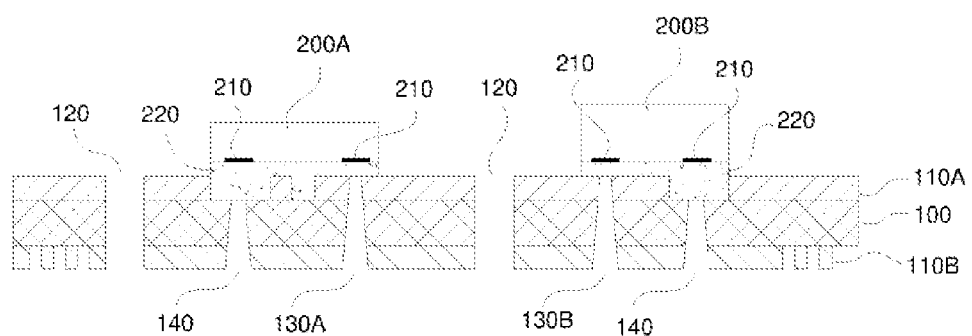
FIG. 9 is a structural view of mounting electronic parts on the substrate according to Embodiment 2 of the present disclosure.

As shown in FIG. 9, the electronic parts 200A and 200B are pasted to the substrate 100 by a patch material 220.

Figure 10:
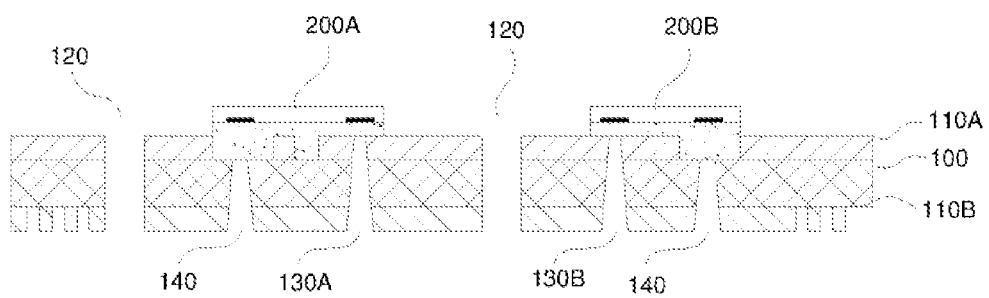
FIG. 10 is a structural view of thinning the electronic parts according to Embodiment 2 of the present disclosure.

As shown in FIG. 10, after the electronic parts 200A and 200B are mounted on the substrate 100, at this time, positions of the electronic parts 200A and 200B relative to the substrate 100 are fixed, and the thicknesses (the thickness refers to height of the electronic parts protruding relative to the substrate) of the electronic parts 200A and 200B are reduced by grinding, cutting or other methods, and then the packaging layers 300 are fabricated. After the thicknesses of the electronic parts 200A and 200B are reduced, wherein the thicknesses of the electronic parts 200A and 200B may be reduced by grinding, cutting, milling, drilling, chemical etching, physical etching or other methods, the thickness of the packaging layers 300 may be reduced, and the thickness of the packaged entirety constituted by the substrate 100, circuit patterns 110A and 110B, electronic parts 200A and 200B, and packaging layers 300 may be greatly reduced. After the electronic parts 200A and 200B are mounted on the substrate 100, the electronic parts 200A and 200B are thinned, and only that required part of the electronic parts 200A and 200B may be retained, and an excessive part is cut away. The thicknesses of the electronic parts 200A and 200B may be reduced to a minimum degree without considering the mechanical strength required when transferring the electronic parts 200A and 200B.

Figure 11:
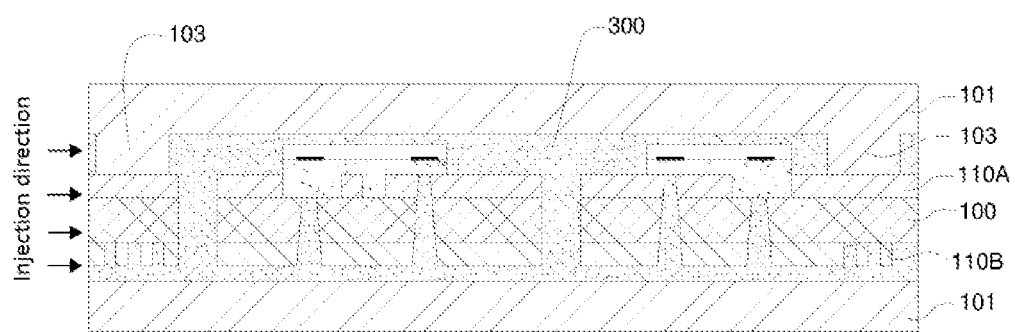
FIG. 11 is a structural view of injecting a thermoplastic material into a mold according to Embodiment 2 of the present disclosure.

As shown in FIG. 11, the substrate 100 having the circuit patterns 110A and 110B and the electronic parts 200A and 200B is placed in the mold 101, and gaps between the two sides of the substrate 100 and the mold 101 are injected with the thermoplastic material. The mold is provided therein with a shaping protrusion configured to mold the external connection hole 140 in the packaging layers (only molding the external connection hole is shown in the present embodiment, but it is not limited thereto, the shaping protrusion may be used to mold the interconnection hole or other structures that need to be molded in the packaging layers). The thermoplastic material is injected into the mold 101, the thermoplastic material wraps the two sides of the substrate 100, and the thermoplastic material is molded into the packaging layers 300 on the two sides of the substrate 100 in the mold 101.

Figure 12:
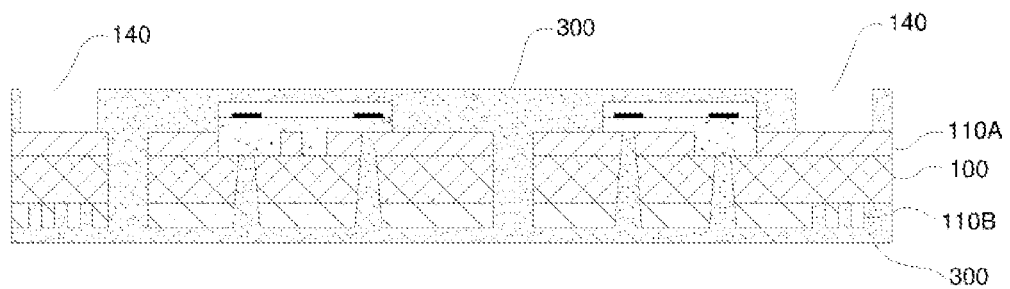
FIG. 12 is a structural view of a molded packaging layer according to Embodiment 2 of the present disclosure.

As shown in FIG. 12, the thermoplastic material is cured on the two sides of the substrate 100 and formed into the packaging layers 300, to encapsulate the substrate 100, the circuit patterns 110A and 110B and the electronic parts 200A and 200B therein. As a shaping portion 103 occupies a part of space of the packaging layer 300, after the substrate 100 is separated from the mold 101, the space originally occupied by the shaping portion 103 becomes the external connection hole 310 in the packaging layer 300.

Figure 13:
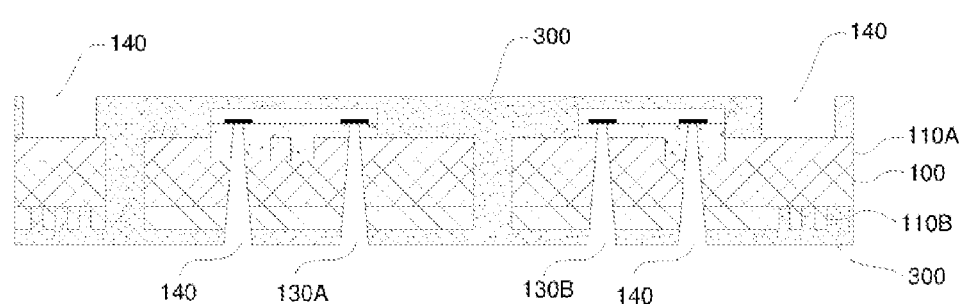
FIG. 13 is a structural view of fabricating external connection holes and interconnection holes in the packaging layer according to Embodiment 2 of the present disclosure.

As shown in FIG. 13, after the packaging layers 300 are fabricated, the circuit patterns 110A and 110B and the electronic parts 200A and 200B are blocked by the packaging layers 300, then the external connection hole 140 and the interconnection hole 130 need to be opened again.

Figure 14:
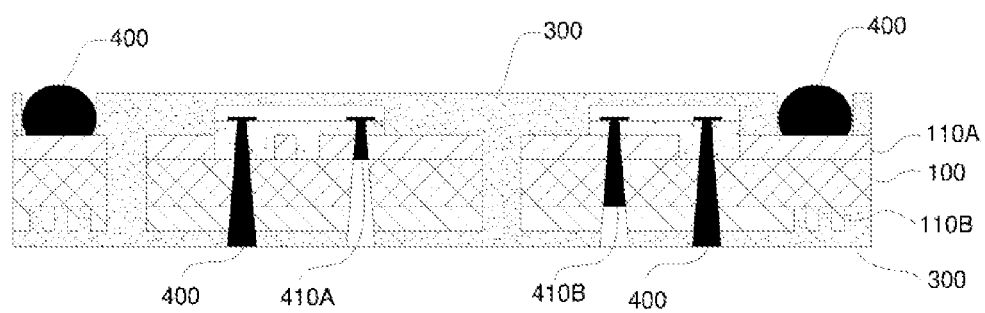
FIG. 14 is a structural view of a packaged circuit board according to Embodiment 2 of the present disclosure.

As shown in FIG. 13, the external connection hole 140 is fabricated in the packaging layer 300 on the first side of the substrate 100, the external connection hole 140 is provided with an opening in the packaging layer 300, and as shown in FIG. 14, an outer pin 400 is fabricated in the external connection hole 140 through the opening of the external connection hole 140, and the outer pin 400 is electrically connected to the circuit pattern 110A.

As shown in FIG. 13, the external connection hole 140 is fabricated in the packaging layers 300 and the substrate 100, and the external connection hole 140 is provided with an opening in the packaging layer 300 on the second side, to expose part pins 210 of the electronic parts 200A and 200B for external connection. As shown in FIG. 14, by fabricating the outer pin 400 in the external connection hole 140 through the opening of the external connection hole 140, the outer pin 400 is electrically connected to the part pins 210 of the electronic parts 200A and 200B. In the present embodiment, the outer pin 400 on the first side of the substrate 100 is BGA.

On the other hand, as shown in FIG. 13 and FIG. 14, the interconnection holes 130A and 130B are fabricated in the substrate 100 and the packaging layers 300, the interconnection holes 130A and 130B are each provided with an opening on a surface of the packaging layer 300 on the second side, the interconnection holes 130A and 130B pass through the packaging layers 300 and the substrate 100 to expose the part pins 210, and the interconnection holes 130A and 130B enable the part pins 210 of the electronic parts 200A and 200B to be butted to the circuit patterns 110A and 110B, and interconnection layers 410A and 410B are fabricated in the interconnection holes 130A and 130B through the openings of the interconnection holes 130A and 130B, so that the electronic part 200A is electrically connected to the circuit pattern 110A on the first side through the interconnection layer 410A, and the electronic part 200B is electrically connected to the circuit pattern 110B on the second side through the interconnection layer 410B, wherein the interconnection layers 410A and 410B may be made of a conductive material or a semiconductor material through a process such as deposition growth, plating, and soldering.

The various technical features in the above embodiments may be combined arbitrarily, and for the sake of conciseness of description, not all possible combinations of various technical features in the above embodiments are described, while the combinations of these technical features should be considered as within the scope of the present description as long as there is no contradiction.

The embodiments above merely express several embodiments of the present disclosure, of which the description is relatively specific and detailed, but they should not be thus construed as limitation on the patent scope of the present disclosure. It should be indicated that a person ordinarily skilled in the art, without departing from the concept of the present disclosure, still could make several modifications and improvements, all of which fall within the scope of protection of the present disclosure. Therefore, the scope of protection of the present patent for invention should be determined by the claims attached.

What is claimed is:

1. A fan-out packaging method, comprising:
   forming at least one via hole in a substrate, wherein the at least one via hole makes two sides of the substrate in communication with each other, and
   fabricating at least one circuit pattern on one side or two sides of a substrate, mounting at least one electronic part on the one side or the two sides of the substrate, and fabricating packaging layers on the two sides of the substrate, wherein the packaging layers on the two sides of the substrate encapsulate therein the substrate, the at least one circuit pattern and the at least one electronic part, and the packaging layers are made of a thermoplastic material, wherein when fabricating the packaging layers on the two sides of the substrate, a part of the packaging layers is enabled to be passed through the at least one via hole, and connecting the packaging layers on the two sides of the substrate with each other through the at least one via hole, wherein forming at least one external connection hole in the packaging layers, the at least one external connection hole is enabled to be butted to a corresponding circuit pattern, or the at least one external connection hole is enabled to be butted to a corresponding electronic part, and providing the at least one external connection hole with an opening on a surface of a corresponding packaging layer; and wherein forming at least one interconnection hole in the substrate and the packaging layers, wherein providing the at least one interconnection hole with an opening on a surface of a corresponding packaging layer, the at least one interconnection hole enables a chip to be butted to a corresponding circuit pattern, fabricating an interconnection layer in the at least one interconnection hole through the opening of the at least one interconnection hole, and electrically connecting the chip to the corresponding circuit pattern through the interconnection layer.

2. The fan-out packaging method according to claim 1, wherein after mounting the at least one electronic part on the substrate, reducing thickness of the at least one electronic part, and then fabricating the packaging layers.

3. The fan-out packaging method according to claim 1, wherein fabricating an outer pin in the at least one external connection hole through the opening of the at least one external connection hole, and electrically connecting the outer pin to the corresponding circuit pattern, or electrically connecting the outer pin to the corresponding electronic part, wherein the outer pin is BGA or LGA.

4. The fan-out packaging method according to claim 1, wherein placing the substrate having the at least one circuit pattern and the at least one electronic part in a mold, injecting the thermoplastic material into the mold, wrapping the two sides of the substrate with the thermoplastic material, and the molding thermoplastic material into the packaging layers on the two sides of the substrate in the mold.

5. The fan-out packaging method according to claim 4, further comprises: providing a support column in the mold, such that when placing the substrate having the at least one circuit pattern and the at least one electronic part in the mold, the support column is enabled to be abutted against and supports the substrate, and injecting the thermoplastic material to gaps between the two sides of the substrate and the mold.

6. The fan-out packaging method according to claim 4, wherein applying a pressure P to unmolded thermoplastic material in the mold, wherein 1.1 atmospheres≤P≤10 atmospheres.

7. The fan-out packaging method according to claim 1, wherein forming an entirety by the substrate, the at least one circuit pattern, the at least one electronic part, and the packaging layers, and the entirety is flexible and bendable.

8. The fan-out packaging plate according to claim 1, wherein at least one external connection hole is formed in the at least one packaging layer, wherein the at least one external connection hole is butted to a corresponding circuit pattern, or the at least one external connection hole is butted to a corresponding electronic part, and the at least one external connection hole is provided with an opening on a surface of a corresponding packaging layer.

9. The fan-out packaging plate according to claim 1, wherein an entirety constituted by the substrate, the at least one circuit pattern, the at least one electronic part, and the at least one packaging layer is flexible and bendable.

10. The fan-out packaging method according to claim 2, wherein an entirety constituted by the substrate, the at least one circuit pattern, the at least one electronic part, and the packaging layers is flexible and bendable.

11. The fan-out packaging method according to claim 2, wherein the thermoplastic material is LCP.

12. A fan-out packaging plate, comprising a substrate, and at least one packaging layer made of a thermoplastic material, wherein one side of the substrate is provided with at least one circuit pattern or at least one electronic part, the substrate and the at least one packaging layer encapsulate the at least one circuit pattern or the at least one electronic part; and alternatively, the substrate is provided with at least one circuit pattern or at least one electronic part, both two sides of the substrate are provided with packaging layers, the packaging layers on the two sides of the substrate encapsulate the substrate, the at least one circuit pattern, and the at least one electronic part, wherein the substrate is provided with at least one via hole, a part of the packaging layers on the two sides of the substrate passes through the at least one via hole, and the packaging layers on the two sides of the substrate are connected with each other through the at least one via hole, the at least one packaging layer is provided with at least one external connection hole, wherein the at least one external connection hole is butted to a corresponding circuit pattern or a corresponding electronic part, and the at least one external connection hole is provided with an opening in a surface of a corresponding packaging layer; and wherein at least one interconnection hole is provided in the substrate and the at least one packaging layer, wherein the at least one interconnection hole is provided with an opening on a surface of a corresponding packaging layer, the at least one interconnection hole is butted to a chip and a corresponding circuit pattern, the at least one interconnection hole is provided therein with an interconnection layer, and the chip is electrically connected to the corresponding circuit pattern through the interconnection layer.

13. The fan-out packaging plate according to claim 12, wherein the at least one external connection hole is provided therein with an outer pin, wherein the outer pin is electrically connected to the corresponding circuit pattern, or the outer pin is electrically connected to the corresponding electronic part, wherein the outer pin is BGA or LGA.

14. The fan-out packaging plate according to claim 12, wherein at least one external connection hole is formed in the at least one packaging layer, wherein the at least one external connection hole is butted to a corresponding circuit pattern, or the at least one external connection hole is butted to a corresponding electronic part, and the at least one external connection hole is provided with an opening on a surface of a corresponding packaging layer.

15. The fan-out packaging plate according to claim 12, wherein an entirety constituted by the substrate, the at least one circuit pattern, the at least one electronic part, and the at least one packaging layer is flexible and bendable.

* * * * *